United States Patent [19]

Chen

[11] Patent Number: 5,320,882
[45] Date of Patent: Jun. 14, 1994

[54] LASER ABLATIVE PARTICULATE COMPOSITE

[75] Inventor: Li-Chyong Chen, Schenectady, N.Y.

[73] Assignee: General Electric Company, Schenectady, N.Y.

[21] Appl. No.: 872,231

[22] Filed: Apr. 22, 1992

[51] Int. Cl.$^5$ .................. B05D 3/06; B23K 26/00
[52] U.S. Cl. ................... 427/597; 427/561; 219/121.85
[58] Field of Search ............. 427/597, 596, 561, 586; 219/121.85; 204/192.1

[56] References Cited

U.S. PATENT DOCUMENTS

| | | | |
|---|---|---|---|
| 4,281,030 | 7/1981 | Silfvast | 427/561 |
| 4,762,975 | 8/1988 | Mahoney et al. | 427/596 |
| 4,816,293 | 3/1989 | Hiramoto et al. | 427/596 |
| 5,002,798 | 3/1991 | Donley et al. | 427/596 |
| 5,015,492 | 5/1991 | Venkatesan et al. | 427/596 |
| 5,093,148 | 3/1992 | Christodoulou et al. | 427/580 |
| 5,096,739 | 3/1992 | Strutt et al. | 427/584 |
| 5,145,713 | 9/1992 | Venkatesan et al. | 427/569 |
| 5,168,097 | 12/1992 | Araya et al. | 427/596 |
| 5,187,147 | 2/1993 | Ng et al. | 427/596 |
| 5,254,832 | 10/1993 | Gartner et al. | 427/596 |

OTHER PUBLICATIONS

"Solidification Processing of Nb-Cr2 Alloys", D. J. Thoma, J. H. Perepezko, Mat. Res. Soc. Symp. Proc., vol. 194, 1990, pp. 105-113, No month.

"Laser Ablation Deposition of Metallic Thin Films", J. P. Gavigan, Proceedings of NATO ASI, 1990, Jun.

"Velocity Distribution of Micron-Size Particles in Thin Film Laser Ablation Deposition (LAD) of Metals and Oxide Superconductors", H. Dupendant, J. P. Gavigan, D. Givord, A. Lienard, J. P. Rebouillat, Y. Souche, Applied Surface Science 43 (1989) pp. 369-376, No month.

"Pulsed-laser evaporation technique for deposition of thin films: Physics and theoretical model", R. K. Singh, J. Narayan, Physical Review B, vol. 41, No. 13, May 1, 1990, pp. 8843-8859.

"Laser-Improved Alloys Could Lead to More Efficient Engines" Jyoti Mazumder, MRS Bulletin/Feb. 1992.

"One-dimensional steady-state model for damage by vaporation and liquid expulsion due to laser-material interaction", C. L. Chan, J. Mazumder, J. Appl. Phys. 62(11), Dec. 1, 1987, pp. 4579-4586.

"Innovative Processing Techniques for Intermetallic Matrix Composites", N. S. Stoloff, D. E. Alman, Mat. Res. Soc. Symp. Proc., vol. 194, 1990, pp. 31-43, No month.

"Ductile Phase Toughening of Brittle Intermetallics", D. L. Anton, D. M. Shah, Mat. Res. Soc. Symp. vol. 194, 1990, pp. 45-52, No month.

"Intermetallic Matrix Composites by Physical Vapor Deposition", D. A. Hardwick, R. C. Cordi, Mat. Res. Soc. Symp. Proc., vol. 194, 1990, pp. 65-70, No month.

"Tailored Microstructures of Niobium-Silicides by Physical Vapor Deposition", R. S. Bhattacharya, A. K. Rai, M. G. Mendiratta, Mat. Res. Soc. Symp. Proc., vol. 194, 1990, pp. 71-78, No month.

"Laser-Induced Formation and Surface Processing of High-Temperature Superconductors", D. Bauerle, Applied Physics A 48, (1989), pp. 527-542, No month.

"Growth of Thin Films by Laser-Induced Evaporation", J. T. Cheung, H. Sankur CRC Critical Reviews in Solid State and Materials Sciences, Vo. 15, Issue 1, 1988, pp. 63-109, No month.

*Primary Examiner*—Marianne Padgett
*Attorney, Agent, or Firm*—James Magee, Jr.

[57] ABSTRACT

A single step method of forming a composite of ductile niobium particles within a matrix of brittle niobium aluminum is taught. The method involves completely ablating the end of a rod of a niobium aluminum intermetallic with a laser beam to form a plume of vaporous and particulate material and depositing the ablated material on a receiving surface disposed proximate the rod end being ablated. A surface composite structure is formed in a single step and has ductile particles within a brittle matrix.

2 Claims, 4 Drawing Sheets

LASER ABLATIVE PARTICULATE COMPOSITE

BACKGROUND OF THE INVENTION

The present invention relates generally to particulate composites made by laser ablative deposition. More particularly, the invention relates to a particulate composite alloy made by a single step laser ablative deposition method.

It is known that a laser can deliver an extremely high level of energy to a small surface area and to a volume of a material beneath the small surface area. The delivery of such high levels of energy causes the removal of a volume of material from the affected surface in the form of a plume of vaporized and ablated material and by a process which is described as ablative or ablation. The plume may also include radicals, ions, electronically excited species, electrons, photons, liquid droplets, microscopic as well as macroscopic particles in a variety of concentrations.

I have found that when a candidate metal is ablated and the material of the plume deposits on a surface, it may be made to form a metallic film which includes particles within a matrix of metal and other condensate. I have also found that for most materials the density and size of particles generated in the laser ablation process increases with increasing laser fluence. The various mechanisms by which the different constituents of a plume agglomerate or condense to form the film is not fully understood. Also, there is not a high degree of predictability as to precisely the form of film which will result when the ablation process is applied to a designated material. For some applications, the presence of particles in a deposited film can be deemed detrimental. For example, in efforts to form high temperature superconductors, the presence of particles is generally deemed to be adverse to the quality of the film for this purpose. For other applications, the presence of particulate matter may be deemed desirable. One problem in operating the ablation process is to increase the control over the mix of ablation products formed from the process. I have found that it is possible to form a particulate composite, that is, a composite in which particles are deposited within a matrix of a host metal, by a single step ablative processing.

BRIEF STATEMENT OF THE INVENTION

In one of its broader aspects, objects of the present invention can be achieved by providing a source material from which a Composite structure is to be formed. The source material is first formed into a laser target having a cross section which permits the ablation of rod metal and may permit ablation of the entire cross section of the rod. A high energy laser is directed at a target to cause an ablation of the target metal. A receiving surface is disposed proximate the laser target metal at which laser ablation is to be carried out. As a result of the laser ablation, material of the target is ablated and condensed onto the receiving surface to form a composite film thereon. By continuing the ablation process or by carrying it out at high fluence desirable films, foils, sheets, and other composite structures can be formed. To improve uniformity, it is preferred to carry Out the ablation process with a rotating source rod or to raster the laser beam across the source rod surface.

BRIEF DESCRIPTION OF THE DRAWINGS

The detailed description of the invention which follows will be understood with greater clarity if reference is made to the accompanying drawings in which.

DETAILED DESCRIPTION OF THE INVENTION

Figure 1:
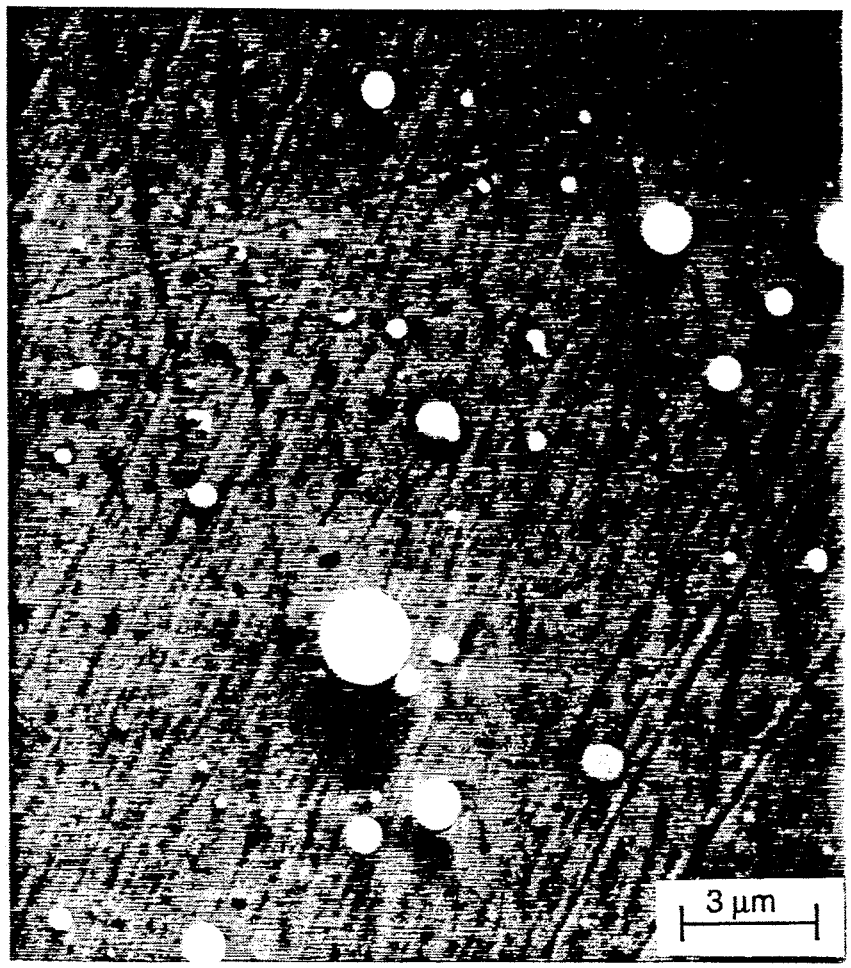
FIG. 1 is a micrograph of a composite film made by a single step laser ablative deposition.

It is desirable to form composite structures in which particulate matter is present. More specifically, it is desirable to form composite structures in which the particles are of very small dimensions of the order of several microns down to a fraction of a micron. Such composites are deemed useful in applications which require high stiffness to weight ratio or high abrasion resistance.

I have found that laser ablative deposition can be used to synthesize a composite material which is characterized by having particulate matter embedded within a uniform matrix. Moreover, I have found that this synthesis can be accomplished in a single step.

The manner in which a laser ablative processing can be used to form a structure is now described with reference to FIG. 5. Referring specifically to the FIGURE, it is a schematic plan view of an apparatus in which the laser ablative deposition can be carried out. The process is preferably carried out within an evacuated tank-like apparatus 10. This structure has a generally cylindrical wall 12 having a number of ports. A port 14 provides means for evacuating the chamber 16. Elements can be introduced into and removed from the chamber through the opposite ports 18 and 20 by manipulation of the respective flange elements 22 and 24. A receiving substrate structure 26 is mounted to flange 22 by supporting rod 28. Heating means 30 mounted to the receiving surface 26 can be provided and heating is accomplished through electric supply means not shown.

A source metal 32 may be mounted at the end of a rotatable supporting rod 34 and a rod can be mounted through flange 24 for rotation by an external mechanism not shown. The laser energy is directed through a port 36 from an external source not shown and through a window in flange 38. The laser may be focused by lens means 40 and directed onto the surface of source metal 32. A plume 42 forms as a result of the incidence of the laser beam on the rotating source metal 32. The plume causes a deposit of matrix and particulate metal on the receiving member 26 and a composite structure is formed thereby. Observation of the processing can be carried out with suitable filtering by observing through the viewports 44 and 46.

The process as taught herein can be understood more clearly by consideration of the following examples:

EXAMPLE 1

Figure 5:
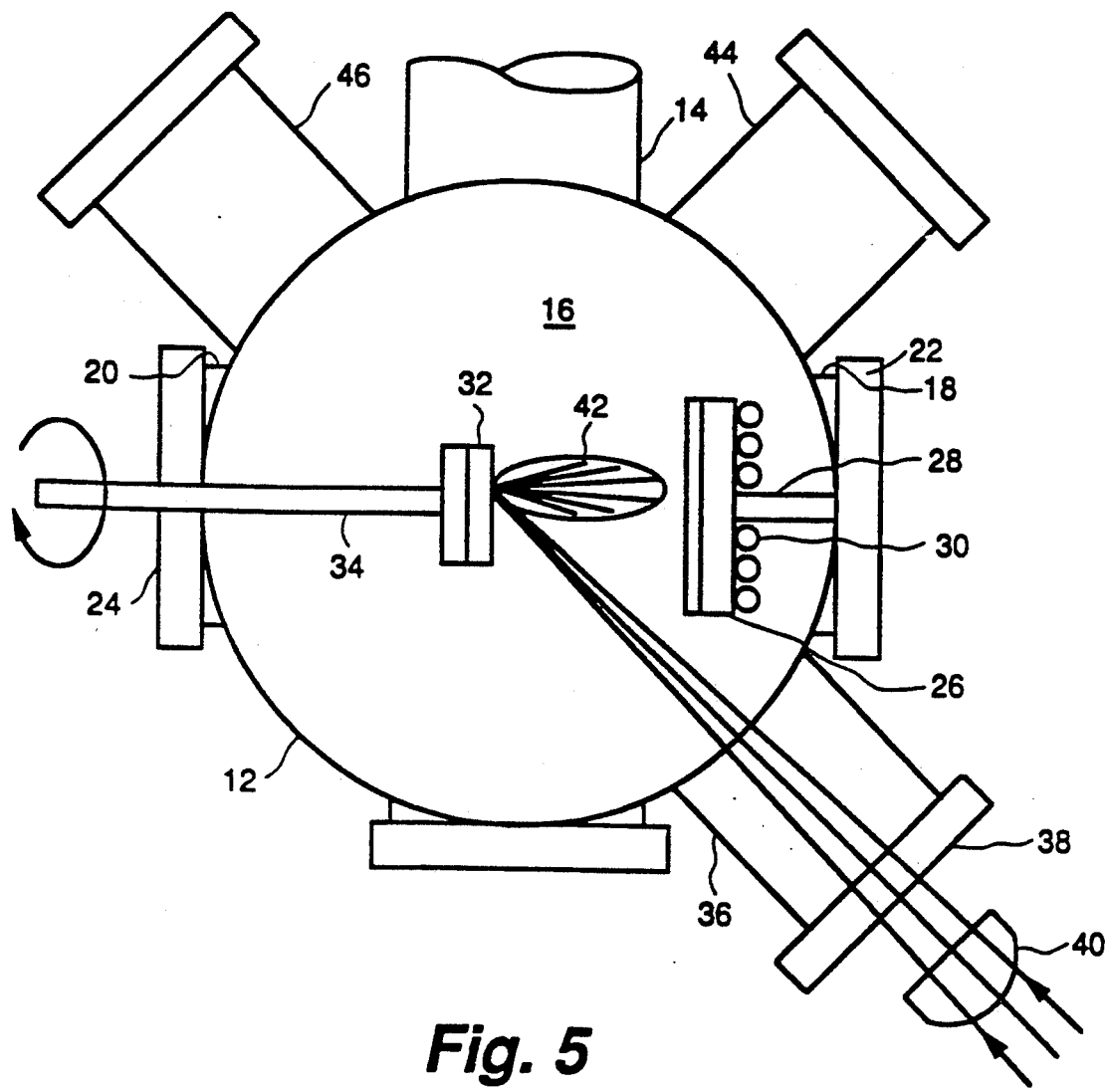
FIG. 5 is a semischematic plan view of an apparatus in which laser ablative formation of a surface deposit may be carried out.

A composite film was made by laser ablation of an $Nb_3Al$ rod target or source in a chamber such as 16 of FIG. 5 at a pressure of $10^{-7}$ torr. The laser employed in this example was a 248 nanometer Krypton fluoride Excimer Laser. I have found that a shorter wavelength is preferred because of smaller reflectivity of 248 nanomete laser beam in metals and hence the higher efficiency of photon absorption. The rod was a disc of $Nb_3Al$ having a length of about ¼ inch and a diameter of about 1 inch rotated at 20 rpm The laser was incident on the target at 45° and the focused spot size was 2 mm by 0.2 mm.

Fluence was varied by varying the pulsed laser energy and the pulsed laser energy was measured in front of the processing chamber window by a power meter. Prior to film deposition, the deposition rate as a function of fluence was measured by a quartz crystal microbalance located in the same position as the substrate for future film deposition. Oxygen free high conductance copper substrate was used. The substrate holder consisted of an Inconel heater with a chromel-alumel thermocouple welded to the backside of the substrate. An Omega CN-2012 temperature controller was used to control the substrate temperature to within ±2° C. The substrate-to-target distance was 5.5 cm.

The film which is formed consists of a homogeneous matrix with particulate inclusions. These inclusions are shown both through SEM and TEM micrographs in the attached FIGURES. FIG. 1 is a top view of a Nb-Al/Nb composite film made by laser ablative deposition. The micrograph shows particles having dimensions of a few microns to a fraction of a micron and the micrograph was prepared by SEM microscopy.

Figure 2:
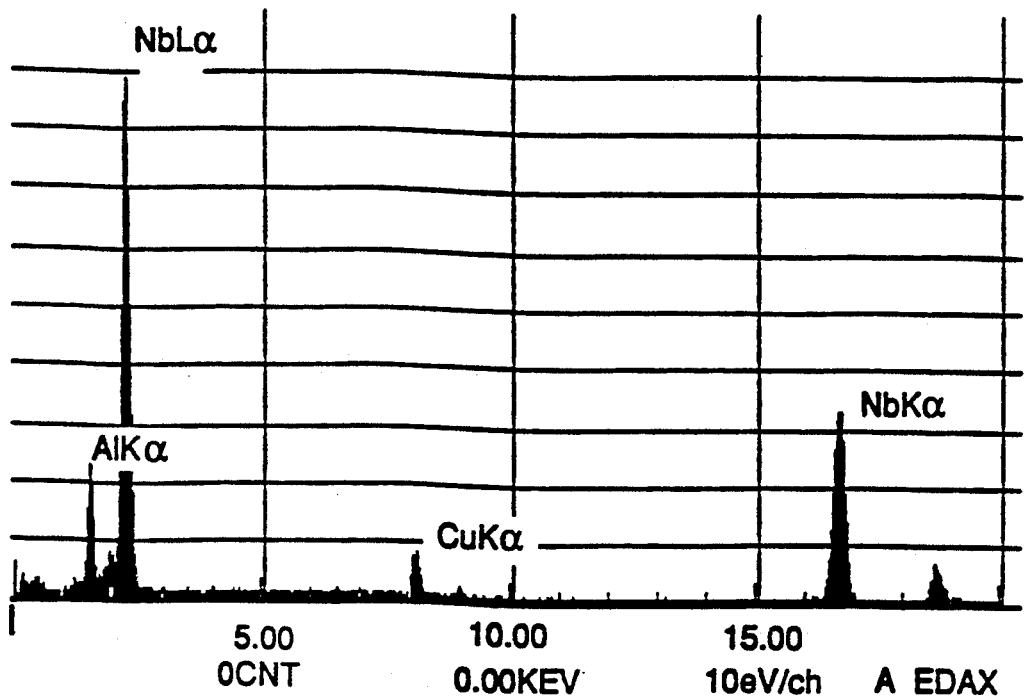
FIG. 2 is an EDX spectrum taken from a featureless matrix.
Figure 3:
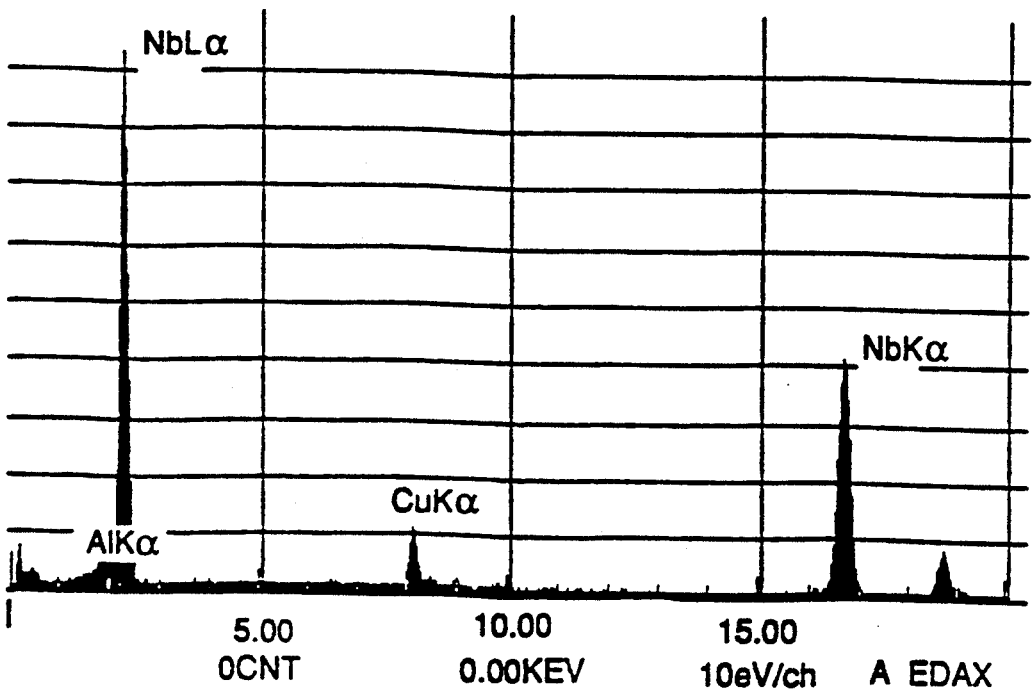
FIG. 3 is an EDX spectrum taken from particulate material.
Figure 4:
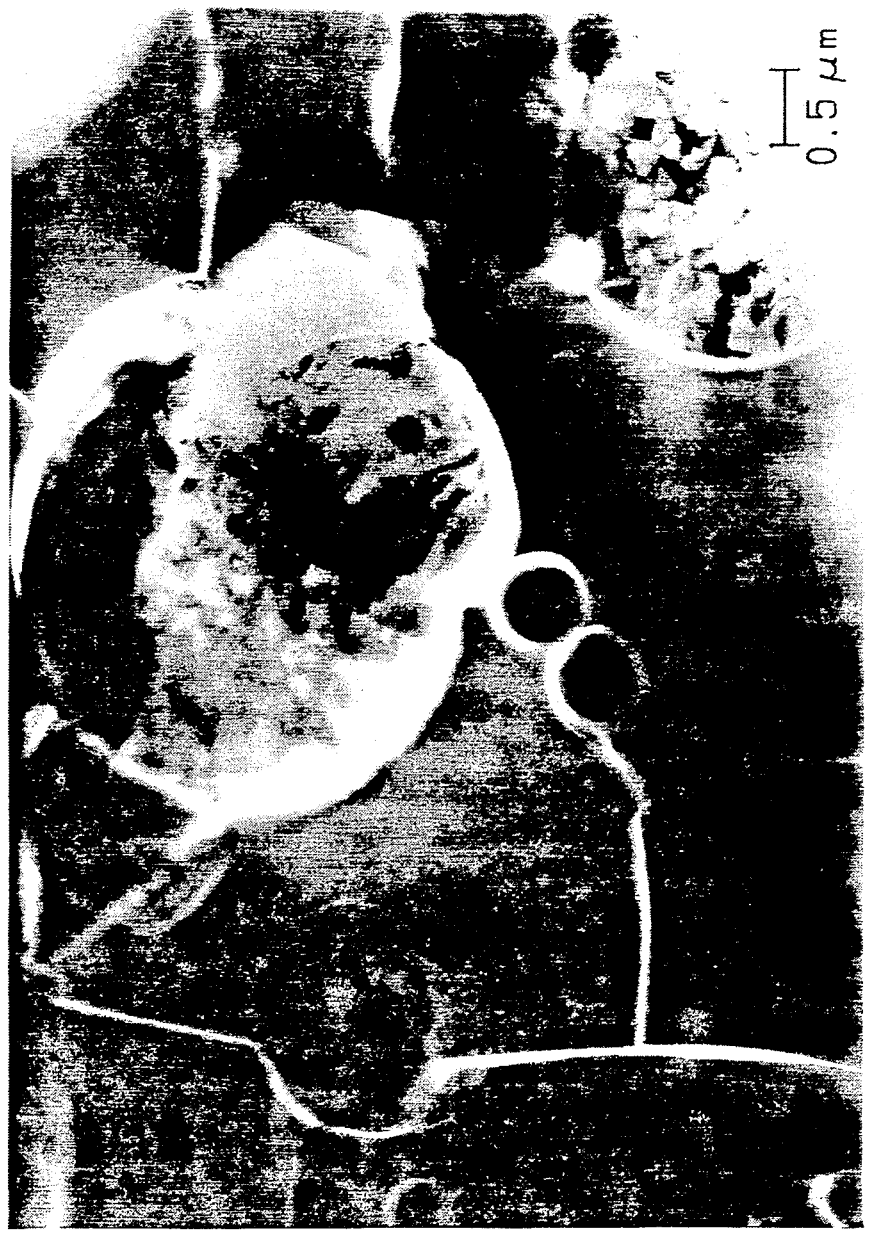
FIG. 4 is a TEM micrograph at a magnification of 30,000X.

FIG. 4 is a similar micrograph but one prepared by TEM microscopy. The matrix of the composition prepared by this example was deemed to have a composition of $Nb_7Al_3$. The particulate material was found to be free of detectable aluminum. The corresponding EDX spectra of the matrix and particulate are shown in FIGS. 2 and 3.

The laser ablative deposition provides a microstructural arrangement having a combination of a ductile phase and a brittle intermetallic materials phase in a single step. This technique also has a flexibility of varying volume fractions of the reinforcing phase by varying the laser fluence.

The idea of particulate composite is to deflect the cracks that initiate in a brittle layer toward the ductile inclusion so that the low temperature fracture toughness is increased. As demonstrated in FIG. 4, the cracks generated during TEM sample thinning process propagate in the brittle layer and finally come to rest at the ductile inclusions.

There are a few unique features that laser ablative deposition can provide. Particles generated by laser ablative deposition PLD are smaller than those formed by conventional techniques (e.g. gas atomization generates particles having particle sizes of the order of $\geq 40$ $\mu$m). In general, particle size in this range (submicron - 10 $\mu$m) gives better results with respect to accomplishing a reinforcing purpose. Laser ablative deposition is both vacuum and atmosphere compatible. HV or UHV (ultra high vacuum) is desirable for high impurity sensitive material such as niobium base alloys. The method of the present invention can be carried out with other metals such as intermetallic compounds, as for example TiAl or $Ti_3Al$. A primary criteria for the candidate intermetallic materials to be used in this process is a material having a large difference between the melting points of the ingredient elements.

What is claimed is:

1. A method for making a composite film having an intermetallic compound matrix and particulate metal inclusions embedded in the matrix which comprises providing a laser target of intermetallic compound forming material, providing a film receiving surface, directing laser energy at the target to form a plume of ablated target material, and condensing the ablated material onto the receiving surface, and thereby forming the intermetallic compound matrix and the particulate inclusions.

2. The method of claim 1 wherein the target is a niobium-aluminum intermetallic compound material and composite is a film of niobium-aluminum intermetallic compound having ductile particles of niobium embedded therein as the particulate inclusions.

* * * * *